United States Patent
Oh et al.

(10) Patent No.: US 7,973,466 B2
(45) Date of Patent: Jul. 5, 2011

(54) ORGANIC ELECTROLUMINESCENT DISPLAY DEVICE WITH LIGHT-SHIELDING MEANS AND METHOD OF FABRICATING THE SAME

(75) Inventors: Du-Hwan Oh, Cheong (KR); Hoon-Ju Chung, Pyeongtaek (KR); Byeong-Koo Kim, Gumi (KR); Yong-Min Ha, Gumi (KR)

(73) Assignee: LG Display Co., Ltd., Seoul (KR)

( * ) Notice: Subject to any disclaimer, the term of this patent is extended or adjusted under 35 U.S.C. 154(b) by 740 days.

(21) Appl. No.: 11/086,674

(22) Filed: Mar. 23, 2005

(65) Prior Publication Data
US 2005/0212447 A1 Sep. 29, 2005

(30) Foreign Application Priority Data
Mar. 23, 2004 (KR) .................. 10-2004-0019734

(51) Int. Cl.
*H01L 51/50* (2006.01)
*H01L 51/52* (2006.01)
*H01L 51/56* (2006.01)

(52) U.S. Cl. ........ 313/501; 313/503; 313/500; 313/512; 313/505; 445/24; 445/25

(58) Field of Classification Search .......... 313/500–512; 315/169.3; 257/72
See application file for complete search history.

(56) References Cited

U.S. PATENT DOCUMENTS

| | | | |
|---|---|---|---|
| 6,194,837 B1 * | 2/2001 | Ozawa | 313/506 |
| 6,641,933 B1 * | 11/2003 | Yamazaki et al. | 313/505 |
| 7,187,122 B2 * | 3/2007 | Kim | 445/24 |
| 2002/0030440 A1 * | 3/2002 | Yamazaki | 313/503 |
| 2002/0104995 A1 * | 8/2002 | Yamazaki et al. | 257/72 |
| 2003/0038595 A1 * | 2/2003 | Miyake et al. | 313/509 |
| 2003/0173897 A1 * | 9/2003 | Iwase et al. | 313/512 |
| 2004/0178724 A1 * | 9/2004 | Karasawa et al. | 313/506 |
| 2005/0067945 A1 * | 3/2005 | Nishikawa et al. | 313/501 |
| 2005/0162082 A1 * | 7/2005 | Nakayama | 313/506 |

\* cited by examiner

*Primary Examiner* — Mariceli Santiago
(74) *Attorney, Agent, or Firm* — McKenna Long & Aldridge LLP

(57) ABSTRACT

An organic electroluminescent display device includes: a substrate having a pixel region and a non-pixel region surrounding the pixel region; a first electrode on the substrate in the pixel region; an organic luminescent layer on the first electrode; a second electrode on the organic luminescent layer; and a light-shielding means corresponding to the non-pixel region.

6 Claims, 14 Drawing Sheets

US 7,973,466 B2

ORGANIC ELECTROLUMINESCENT DISPLAY DEVICE WITH LIGHT-SHIELDING MEANS AND METHOD OF FABRICATING THE SAME

The present application claims the benefit of Korean Patent Application No. 2004-0019734 filed in Korea on Mar. 23, 2004, which is hereby incorporated by reference.

BACKGROUND OF THE INVENTION

1. Field of the Invention

The present invention relates to a display device, and more particularly, to an organic electroluminescent (EL) display device and a method of fabricating the same.

2. Discussion of the Related Art

Among flat panel displays (FPDs), organic electroluminescent (EL) devices have been of particular interest in research and development because they are light-emitting type displays having a wide viewing angle as well as a high contrast ratio in comparison to liquid crystal display (LCD) devices. Organic EL devices are lightweight and small, as compared to other types of display devices, because they do not need a backlight. Organic EL devices have other desirable characteristics, such as low power consumption, superior brightness and fast response time. When driving the organic EL devices, only a low direct current (DC) voltage is required. Moreover, a fast response time can be obtained. Unlike LCD devices, organic EL devices are entirely formed in a solid phase arrangement. Thus, organic EL devices are sufficiently strong to withstand external impacts and also have a greater operational temperature range. Moreover, organic EL devices are fabricated in a relatively simple process involving few processing steps. Thus, it is much cheaper to produce an organic EL device in comparison to an LCD device or a plasma display panel (PDP). In particular, only deposition and encapsulation processes are necessary for manufacturing organic EL devices.

There are two types of organic EL display devices: passive matrix type and active matrix type. While both the passive matrix organic EL display device and the active matrix organic EL display device have simple structures and are formed by a simple fabricating process, the passive matrix organic EL display device requires a relatively high amount of power to operate. In addition, the display size of a passive matrix organic EL display device is limited by its structure. Furthermore, as the number of conductive lines increases, the aperture ratio of a passive matrix organic EL display device decreases. In contrast, active matrix organic EL display devices are highly efficient and can produce a high-quality image for a large display with a relatively low power.

FIG. 1 is a schematic circuit diagram of an organic electroluminescent display device according to the related art. In FIG. 1, a switching thin film transistor (TFT) "$T_S$" as an addressing element is connected to a gate line 22 and a data line 40. A storage capacitor "$C_{ST}$" is connected to the switching TFT "$T_S$" and a driving TFT "$T_D$" as a current source element is connected to the switching TFT "$T_S$" and the storage capacitor "$C_{ST}$." The driving TFT "$T_D$" is also connected to a power line 26 and an organic electroluminescent (EL) diode "E." The switching TFT "$T_S$" adjusts a voltage of a terminal of the driving TFT "$T_D$" and the storage capacitor "$C_{ST}$" stores charges for the voltage of the terminal of the driving TFT "$T_D$."

FIG. 2 is a schematic plane view showing an organic electroluminescent display device according to the related art. In FIG. 2, a gate line 22 is formed along a first direction on a substrate, and a data line 40 is formed along a second direction intersected with the gate line 22, thereby defining a pixel region "P." A power line 26 also is formed along the second direction and spaced apart from the data line 40. A gate insulating layer (not shown) is interposed between the gate line 22 and the data line 40.

In addition, a switching thin film transistor (TFT) "$T_S$" is connected to the gate line 22 and the data line 40. A driving TFT "$T_D$" is connected to the switching TFT "$T_S$" and the power line 26, and a storage capacitor "$C_{ST}$" is connected to the driving TFT "$T_D$." A first electrode 46 is connected to driving TFT "$T_D$," and an organic luminescent layer (not shown) and a second electrode (not shown) are sequentially formed on the first electrode 46.

FIGS. 3A to 3I are schematic cross-sectional views, which is taken along a line III-III of FIG. 2, showing a fabricating process of an organic electroluminescent display device according to the related art.

In FIG. 3A, a buffer layer 12 is formed on a substrate 10. A semiconductor layer 14 of polycrystalline silicon and a first capacitor electrode 16 are formed on the buffer layer 12 through a first mask process.

In FIG. 3B, a first photoresist (PR) pattern 15 is formed on the semiconductor pattern 14 through a second mask process. Next, the first capacitor electrode 16 is doped with impurities using the first PR pattern as a doping mask.

In FIG. 3C, a gate insulating layer 18 is formed on the semiconductor pattern 14 and the first capacitor electrode 16. Next, a gate electrode 20 and a second capacitor electrode 24 are formed on the gate insulating layer 18 through a third mask process. The gate electrode 20 and the second capacitor electrode 24 correspond to a central portion of the semiconductor pattern 14 and the first capacitor electrode 16, respectively. Next, the semiconductor layer 14 is doped with impurities using the gate electrode 20 as a doping mask. Since the gate electrode 14 shields the central portion of the semiconductor layer 14, side portions of the semiconductor layer 14 are doped with impurities and the central portion of the semiconductor layer 14 remains intrinsic. After the doping step, the semiconductor layer 14 includes an active region "Sa" corresponding to the gate electrode 20, a source region "Sb" and a drain region "Sc."

In FIG. 3D, after an activation step for the doped impurities, an interlayer insulating layer 28 is formed on the gate electrode 20 and the second capacitor electrode 24. Next, the interlayer insulating layer 28 and the gate insulating layer 18 are etched through a fourth mask process. Accordingly, a first contact hole 30 exposing the drain region "Sc" and a second contact hole 32 exposing the source region "Sb" are formed in the interlayer insulating layer 28 and the gate insulating layer 18, and a third contact hole 34 exposing the second capacitor electrode 24 is formed in the interlayer insulating layer 28.

In FIG. 3E, a drain electrode 36 and a source electrode 38 are formed on the interlayer insulating layer 28. The drain electrode 36 is connected to the drain region "Sc" through the first contact hole 30. In addition, the source electrode 38 is connected to the source region "Sb" through the second contact hole 32 and is connected to the second capacitor electrode 24 through the third contact hole 34.

In FIG. 3F, a passivation layer 42 is formed on the drain electrode 36 and the source electrode 38. Next, the passivation layer 42 is etched through a sixth mask process to form a drain contact hole 44 exposing the drain electrode 36.

In FIG. 3G, a first electrode 46 is formed on the passivation layer 42 through a seventh mask process. The first electrode 46 is connected to the drain electrode 36 through the drain contact hole 44. Although not shown in FIG. 3G, the first electrode 46 of one pixel region is separated from an adjacent first electrode in another pixel region.

In FIG. 3H, a bank layer 48 is formed on the passivation layer 42 through an eighth mask process. The bank layer 48 covers edge portions of the first electrode 46.

In FIG. 3I, an organic luminescent layer 50 and a second electrode 52 are sequentially formed on the first electrode 46 and the bank layer 48.

FIG. 4 is a schematic cross-sectional view of an organic electroluminescent display device according to the related art. In FIG. 4, an organic electroluminescent (EL) diode "E" is formed on an array layer "AL." The organic EL diode "E" includes a first electrode 46, an organic luminescent layer 50 and a second electrode 52, and the array layer "AL" includes a thin film transistor (TFT) "T," a storage capacitor "$C_{ST}$" and a plurality of signal lines (not shown). A protection layer 54 is formed on the organic EL diode "E" to protect the second electrode 52 of the organic EL diode "E."

The TFT "T," the storage capacitor "$C_{ST}$" and a plurality of signal lines (not shown) of the array layer "AL" include metallic materials. In addition, when the second electrode 52 functions as a cathode, a metallic material such as nickel (Ni) having a relatively low work function is used for the second electrode 52. Accordingly, ambient light may reflect from layer including the metallic materials during the organic EL display device is driven, and reflected light deteriorates display quality of the organic EL display device such as a contrast ratio. For example, when the organic EL display device has a top emission type, ambient light reflects from the second electrode 52 and a first reflected light "R1" is emitted toward users. Similarly, the ambient light reflects from the array layer "AL" such as the TFT "T" and the storage capacitor "$C_{ST}$," and second and third reflected light "R2" and "R3" are emitted toward users. The first, second and third reflected light "R1," "R2" and "R3" may increase brightness of a black image, thereby deteriorating a contrast ratio of the organic EL display device.

As referring again to FIG. 3I, a cleaning step using ultra violet (UV) ray is performed to remove organic particles from the first electrode 46 before the organic luminescent layer 50 on the first electrode 46. However, the UV ray may penetrate the bank layer 48, the passivation layer 42 and the interlayer insulating layer 28 to be irradiated onto the semiconductor layer 14. Accordingly, the semiconductor layer 14 may be deteriorated by the UV ray and the deterioration of the semiconductor layer 14 may cause degradation in characteristics of the TFT. For example, a threshold voltage of the TFT may be changed and a display quality of the organic EL display device is deteriorated.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic electroluminescent display device having an improved display quality by preventing reduction of contrast ratio.

Another object of the present invention is to provide an organic electroluminescent display device having an improved display quality by preventing deterioration in characteristic of a thin film transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes: a substrate having a pixel region and a non-pixel region surrounding the pixel region; a first electrode on the substrate in the pixel region; an organic luminescent layer on the first electrode; a second electrode on the organic luminescent layer; and a light-shielding means corresponding to the non-pixel region.

In another aspect, a method of fabricating an organic electroluminescent display device includes: providing a substrate having a pixel region and a non-pixel region surrounding the pixel region; forming a first electrode on the substrate in the pixel region; forming an organic luminescent layer on the first electrode; forming a second electrode on the organic luminescent layer; and forming a light-shielding means corresponding to the non-pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the preferred embodiments, examples of which are illustrated in the accompanying drawings.

Figure 1:
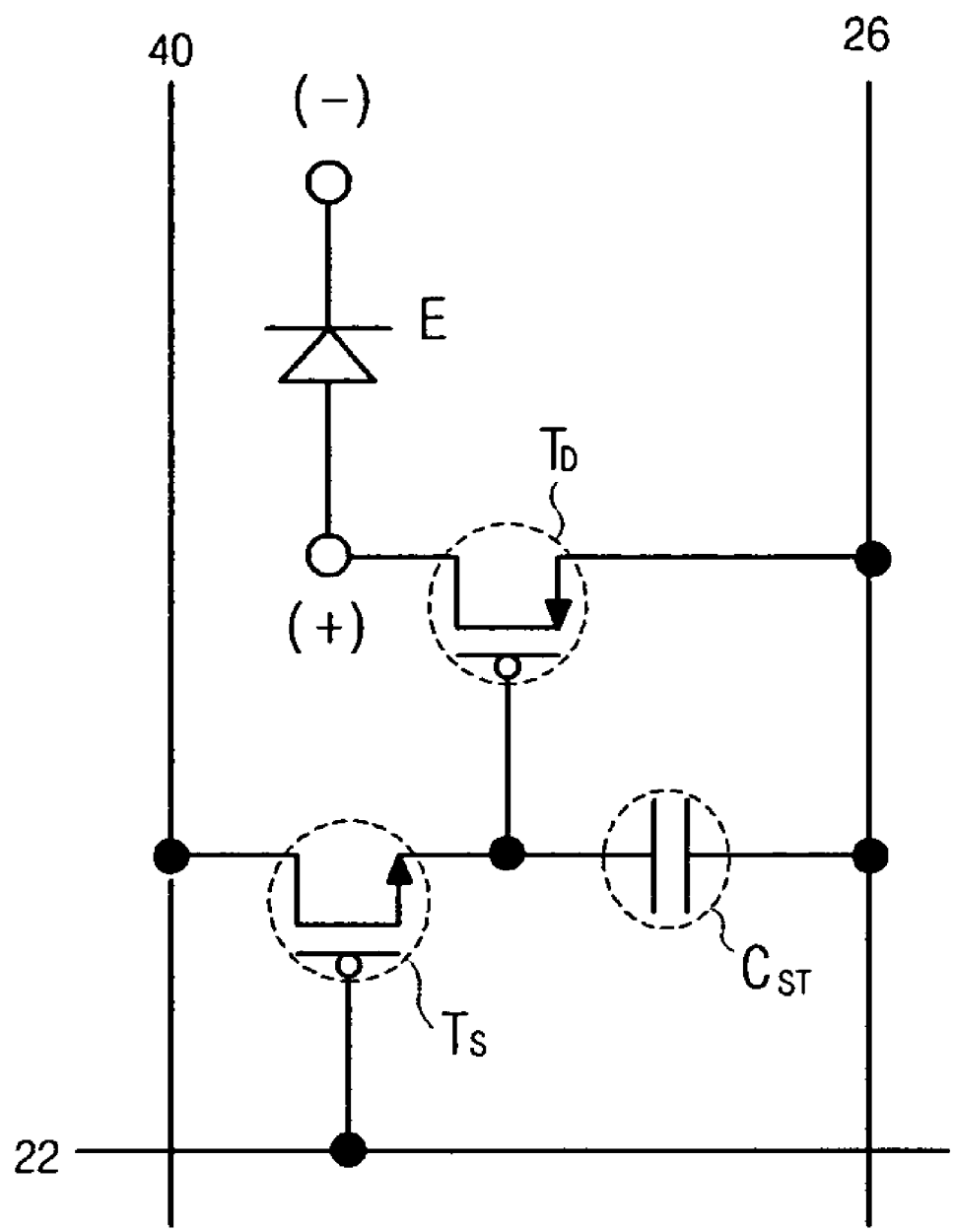
FIG. 1 is a schematic circuit diagram of an organic electroluminescent display device according to the related art.
Figure 2:
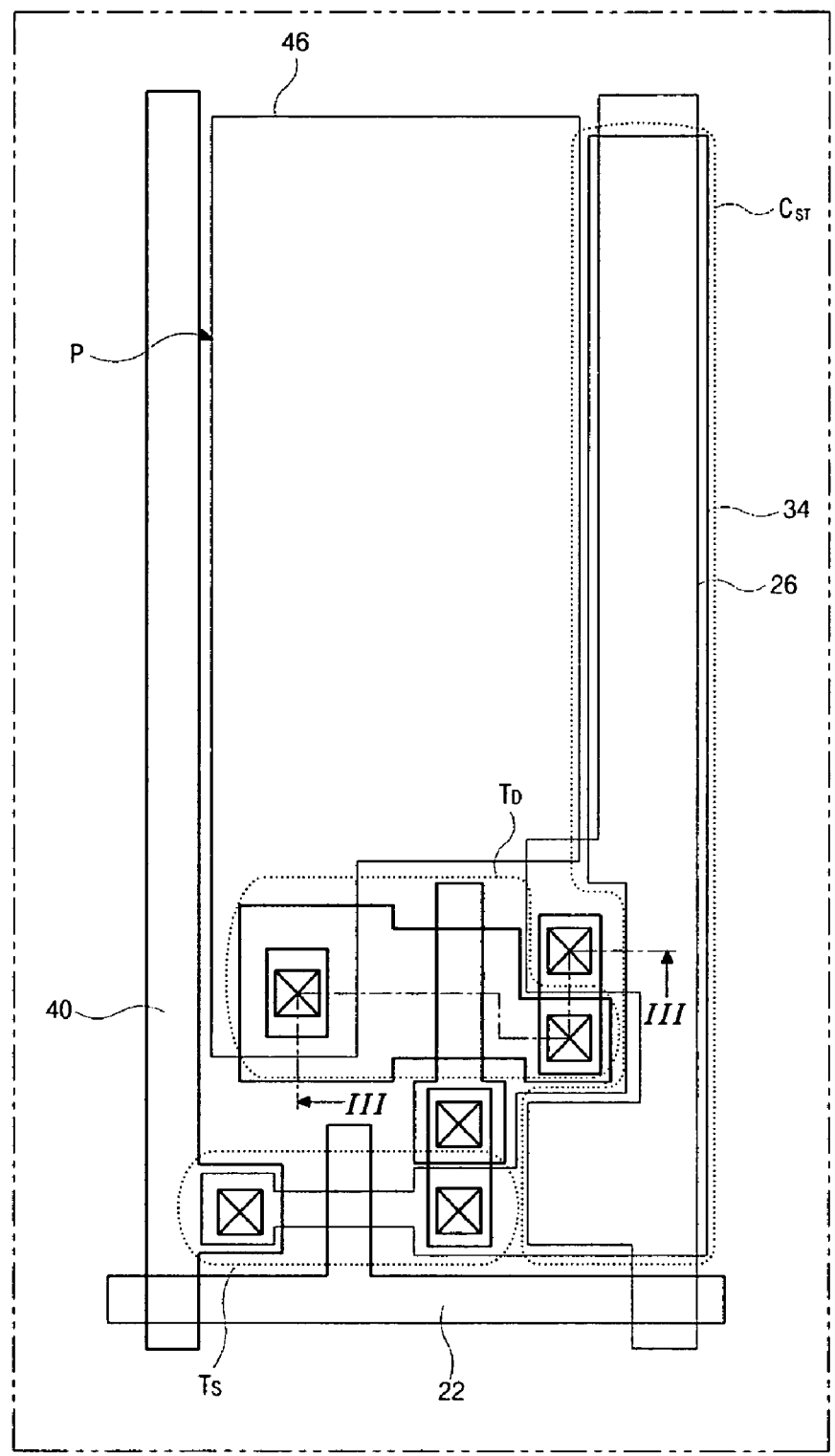
FIG. 2 is a schematic plane view showing an organic electroluminescent display device according to the related art.
Figure 3A:
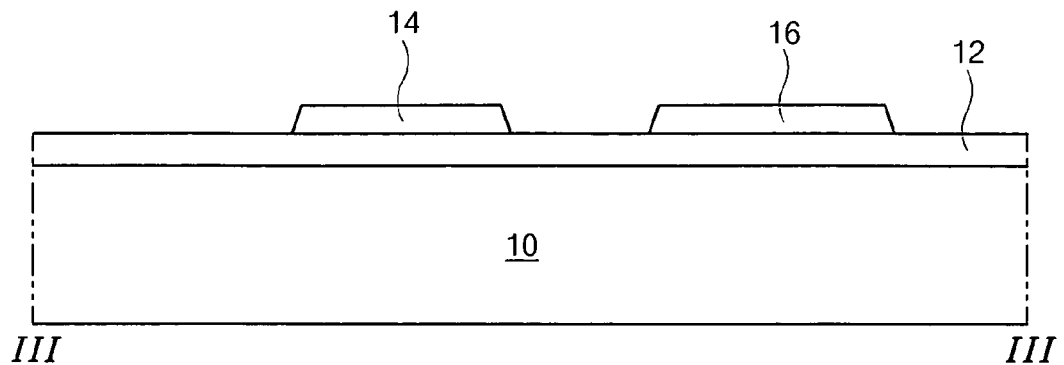
FIGS. 3A to 3I are schematic cross-sectional views, which is taken along a line III-III of FIG. 2, showing a fabricating process of an organic electroluminescent display device according to the related art.
Figure 3B:
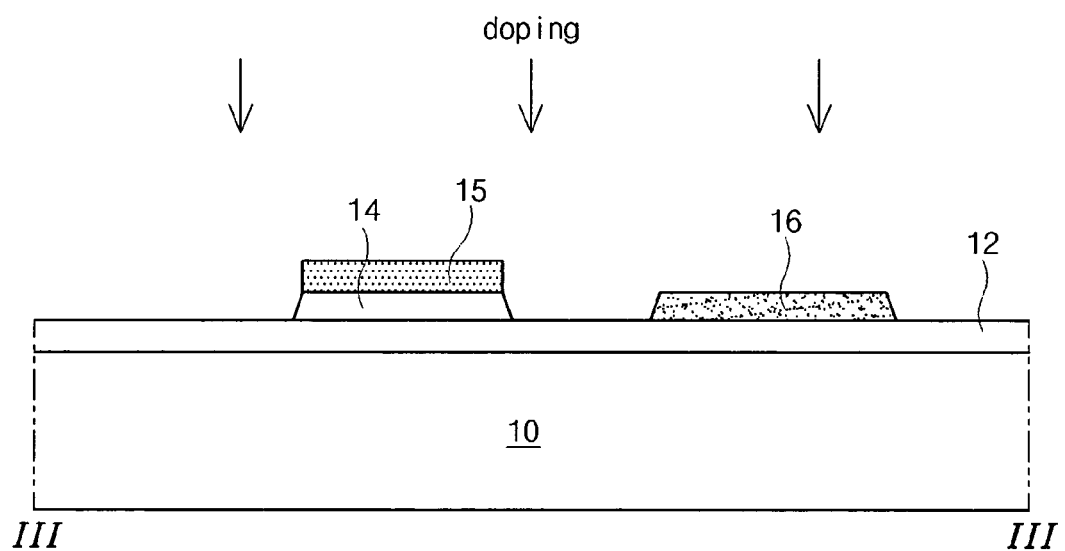
Figure 3C:
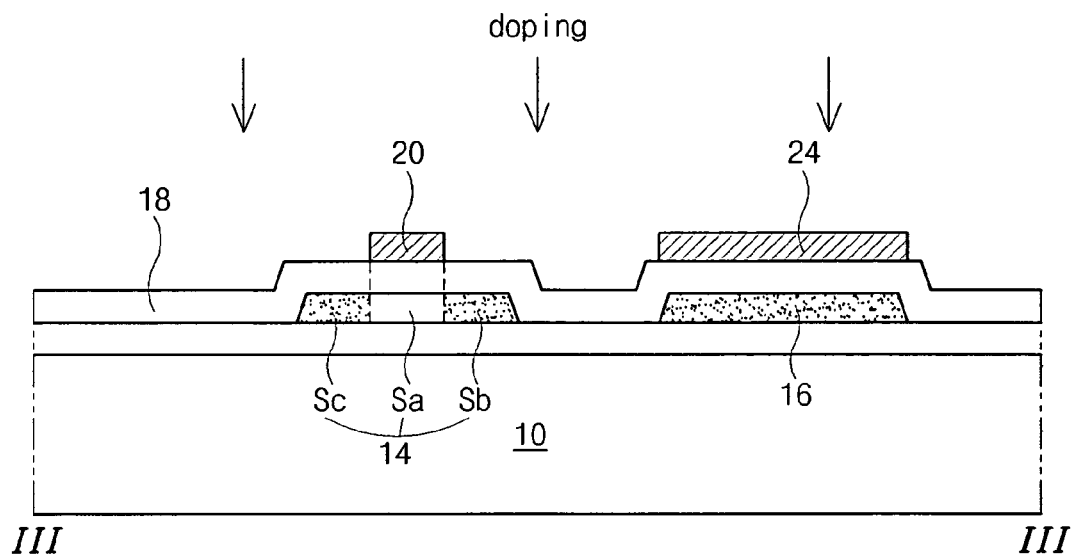
Figure 3D:
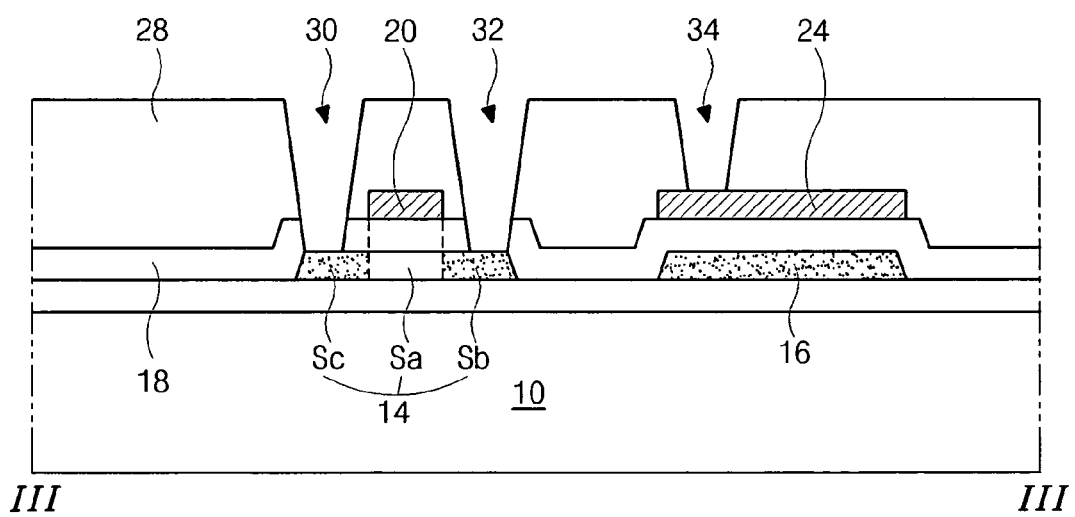
Figure 3E:
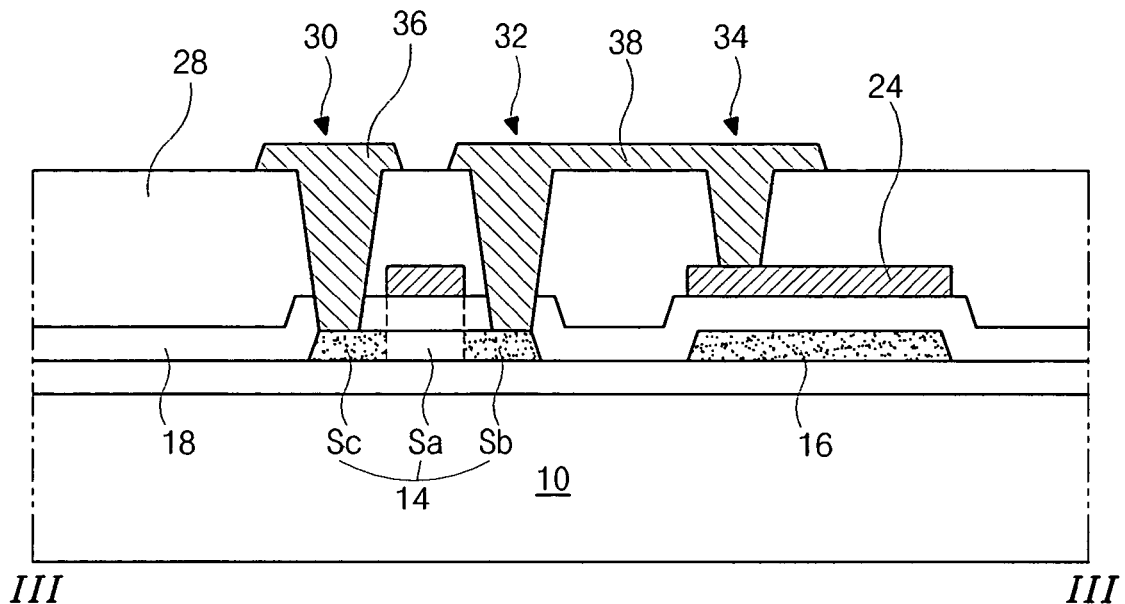
Figure 3F:
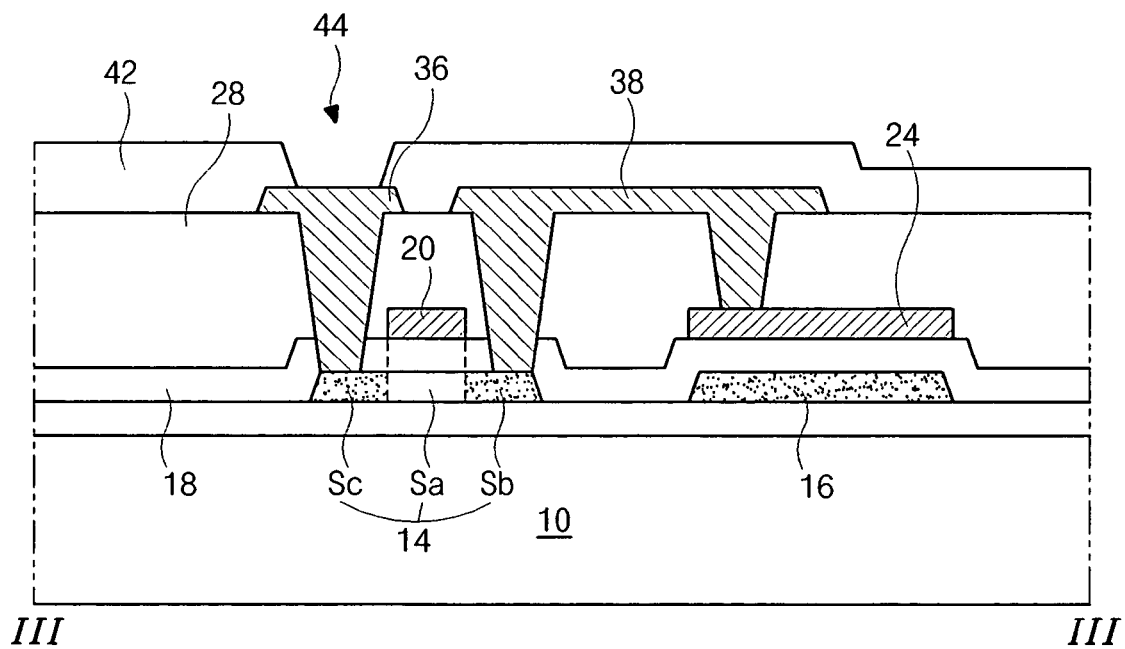
Figure 3G:
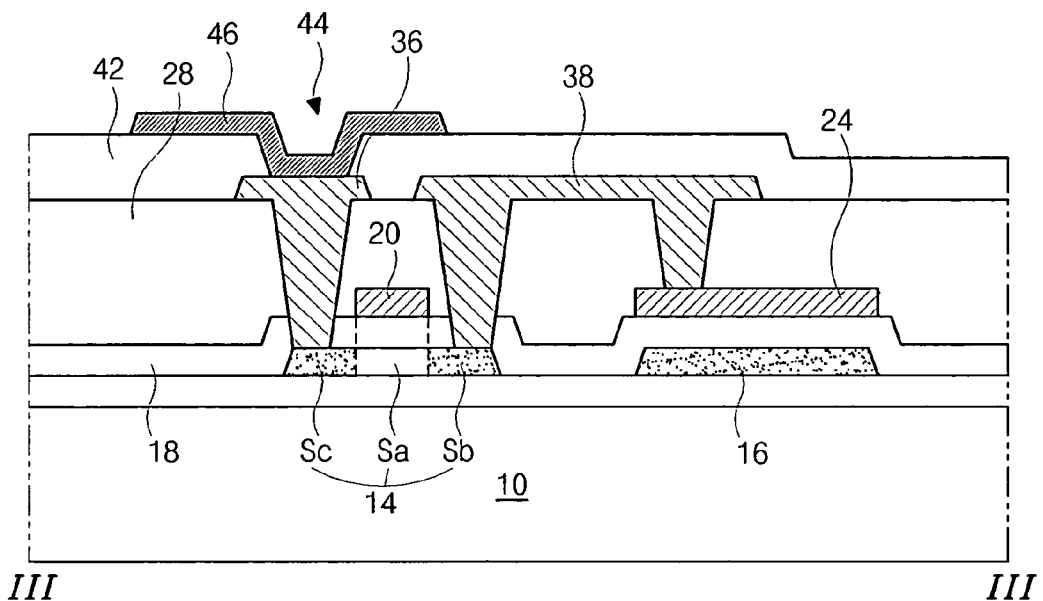
Figure 3H:
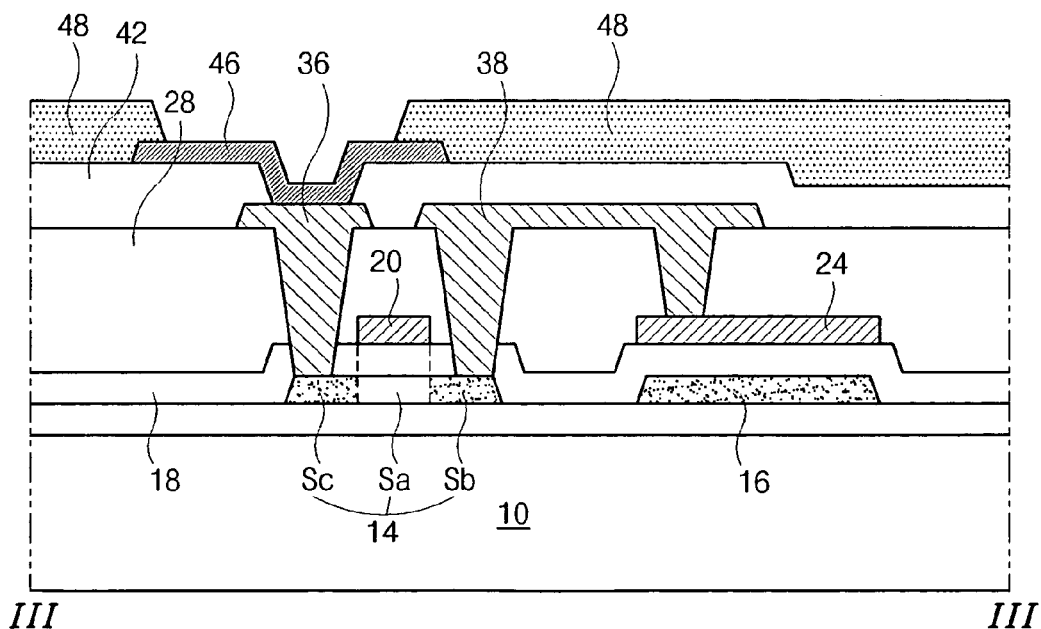
Figure 3I:
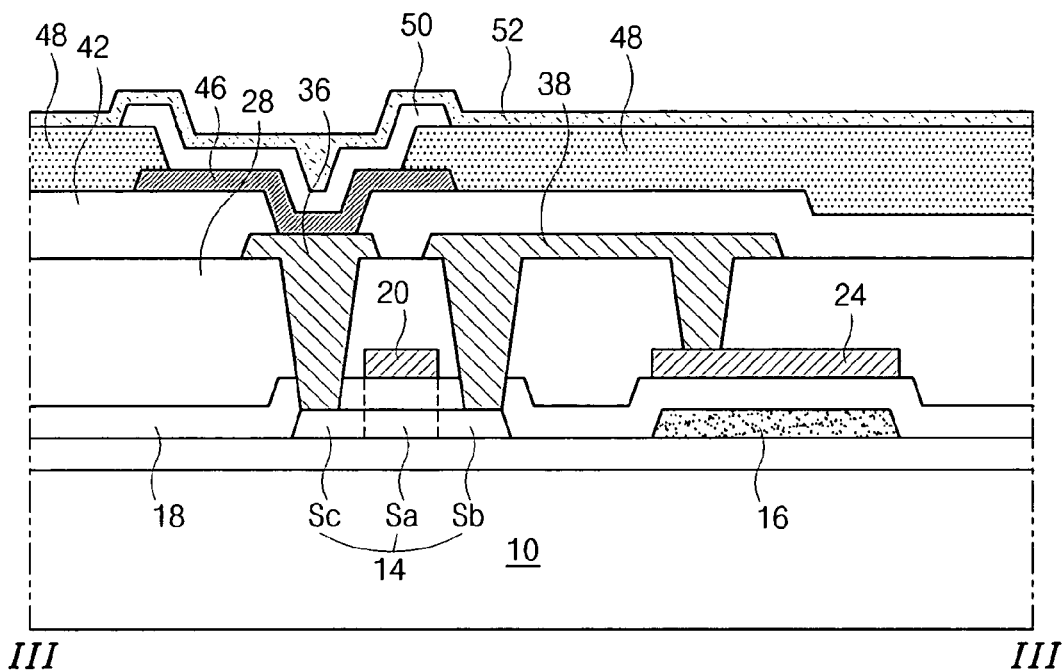
Figure 4:
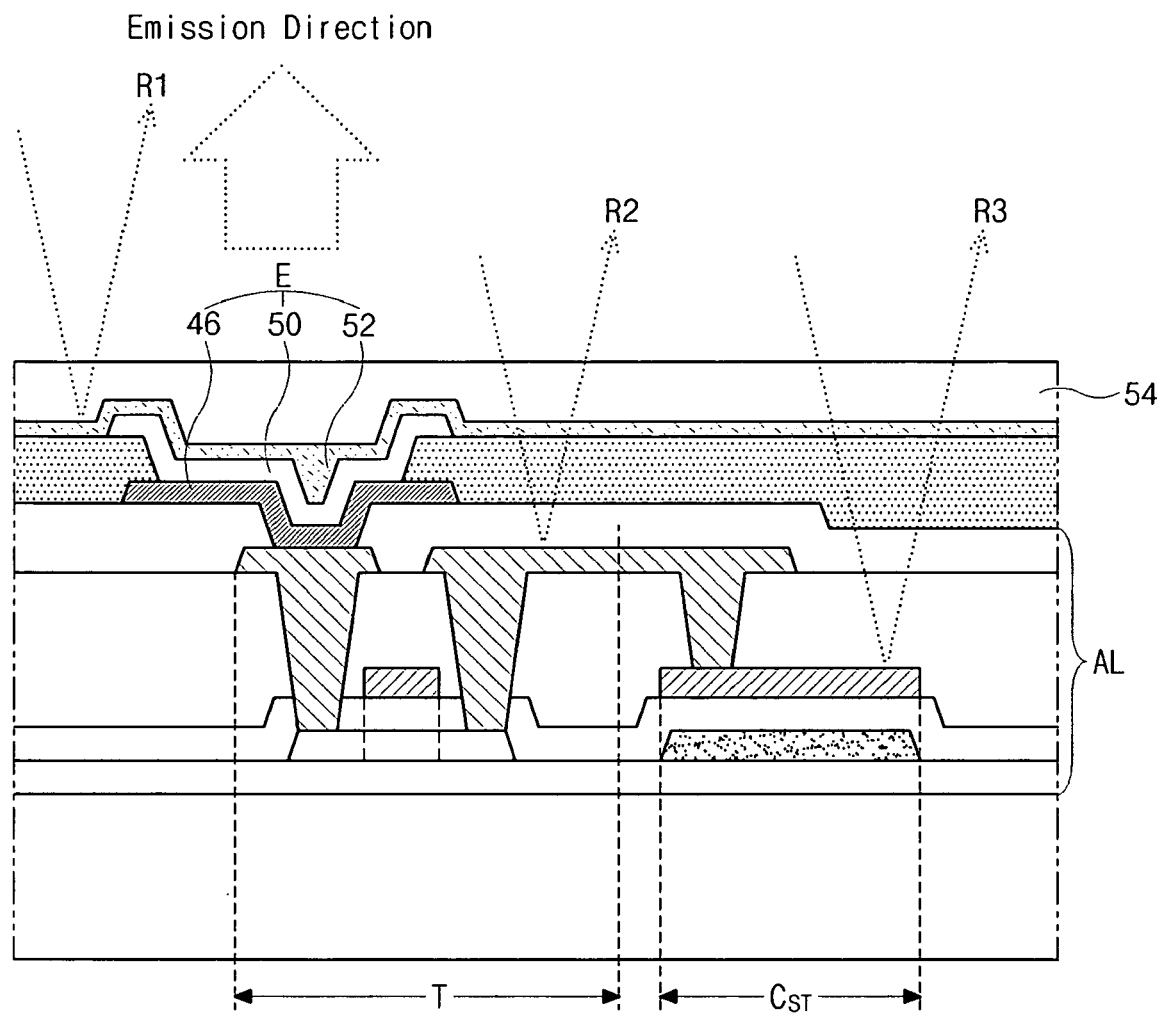
FIG. 4 is a schematic cross-sectional view of an organic electroluminescent display device according to the related art.
Figure 5:
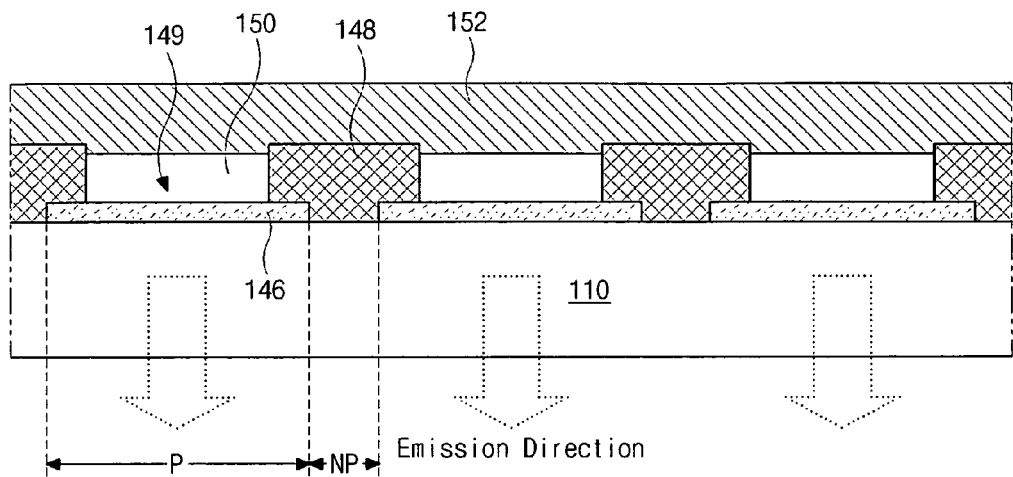
FIG. 5 is a schematic cross-sectional view showing a passive matrix organic electroluminescent display device according to an exemplary embodiment of the present invention.

FIG. 5 is a schematic cross-sectional view showing a passive matrix organic electroluminescent display device according to an exemplary embodiment of the present invention.

In FIG. 5, a first electrode 146 is formed on a substrate 110 having a pixel region "P" and a non-pixel region "NP" surrounding the pixel region "P." The first electrode corresponds to the pixel region "P." A bank layer 148 having an open portion 149 exposing the first electrode 146 is formed on the first electrode 146 and the substrate 110. The bank layer 148 corresponds to the non-pixel region "NP" and covers edge portions of the first electrode 146. Further, an organic luminescent layer 150 is formed on the first electrode 146 in the open portion 149. Accordingly, the adjacent organic luminescent layers 150 of the adjacent pixel regions "P" are separated from each other. A second electrode 152 is formed on the organic luminescent layer 150 and the bank layer 148.

Since the organic electroluminescent (EL) display device has a passive matrix type, an additional switching element such as a thin film transistor (TFT) is not formed in the organic EL display device. In addition, when the first electrode 146 is formed to be transparent, light generated in the organic luminescent layer 150 is emitted through the first electrode 146 and the organic EL display device may be referred to as a bottom emission type. For example, the first electrode 146 may be formed to be transparent by using a transparent conductive material such as indium-tin-oxide (ITO) and indium-zinc-oxide (IZO) or by depositing a metallic material too thin to be transparent.

In this embodiment, the bank layer 148 is formed of a visible-shielding material shielding a visible ray. When the visible-shielding material having a transmittance lower than about 10% for visible ray having a wavelength within a range of about 380 nm to about 780 nm is used for the bank layer 148, ambient light toward the second electrode 152 may be shielded by the bank layer 148. Accordingly, most of reflection of the ambient light from the second electrode 152 may be prevented and reduction of contrast ratio is prevented. A light transmittance may be expressed as an optical density (OD) defined by the equation OD=−Log(T), where T is transmittance. Accordingly, a transmittance lower than about 10% may be expressed as an OD higher than about 1.

Figure 6:
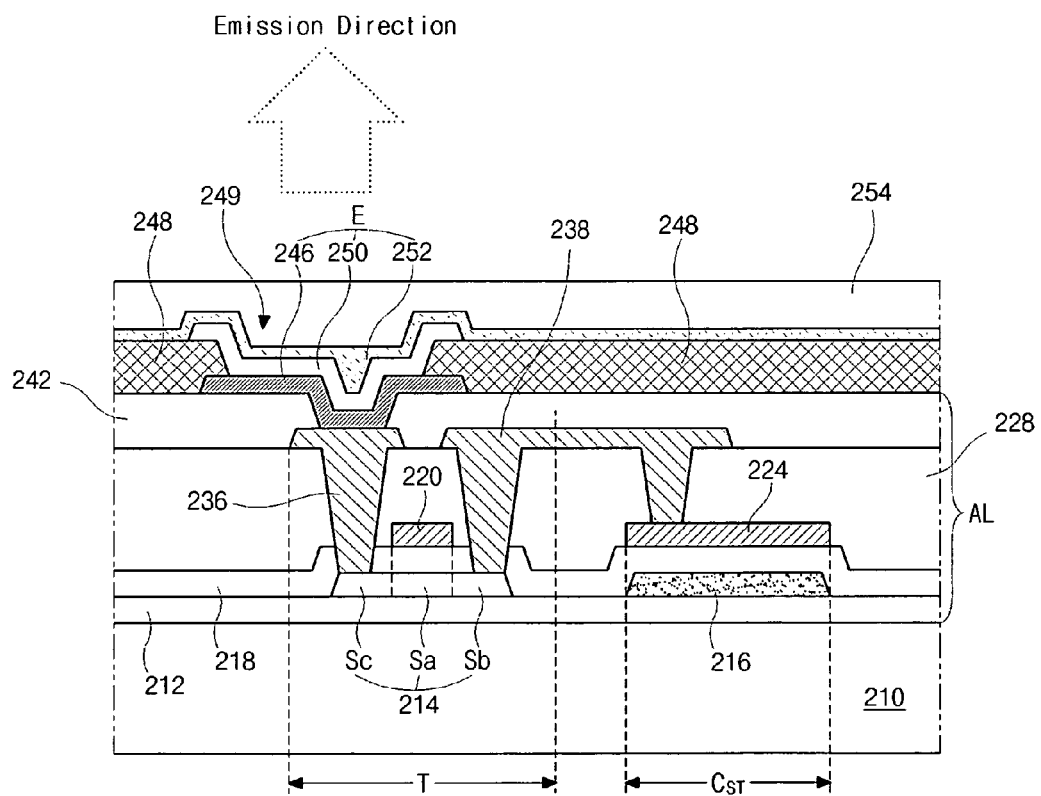
FIG. 6 is a schematic cross-sectional view showing an active matrix organic electroluminescent display device according to another exemplary embodiment of the present invention.

FIG. 6 is a schematic cross-sectional view showing an active matrix organic electroluminescent display device according to another exemplary embodiment of the present invention.

In FIG. 6, an organic electroluminescent (EL) diode "E" is formed on an array layer "AL." The organic EL diode "E" includes a first electrode 246, an organic luminescent layer 250 and a second electrode 252, and the array layer "AL" includes a thin film transistor (TFT) "T," a storage capacitor "$C_{ST}$" and a plurality of signal lines (not shown). For example, a plurality of gate lines and a plurality of data lines may be formed as the array layer "AL." The TFT "T" includes a semiconductor layer 214, a gate electrode 220 over an active region "Sa" of the semiconductor layer 214, a drain electrode 236 connected to a drain region "Sc" of the semiconductor layer 214 and a source electrode 238 connected to a source region "Sb" of the semiconductor region "Sb." A protection layer 254 is formed on the organic EL diode "E" to protect the second electrode 252 of the organic EL diode "E." A bank layer 248 having an open portion 249 is formed on the first electrode 246. The bank layer 248 covers edge portions of the first electrode 246 and the open portion 249 exposes the first electrode 246.

When the second electrode 252 is formed to be transparent, light generated in the organic luminescent layer 250 is emitted through the second electrode 252 and the organic EL display device may be referred to as a top emission type. In this embodiment, the bank layer 248 is formed of a visible-shielding material shielding a visible ray. When the visible-shielding material having a transmittance lower than about 10% for visible ray having a wavelength within a range of about 380 nm to about 780 nm is used for the bank layer 248, ambient light toward the TFT "T," the storage capacitor "$C_{ST}$" and the plurality of signal lines may be shielded by the bank layer 248. Accordingly, most of reflection of the ambient light from the TFT "T," the storage capacitor "$C_{ST}$" and the plurality of signal lines may be prevented and reduction of contrast ratio is prevented.

Figure 7A:
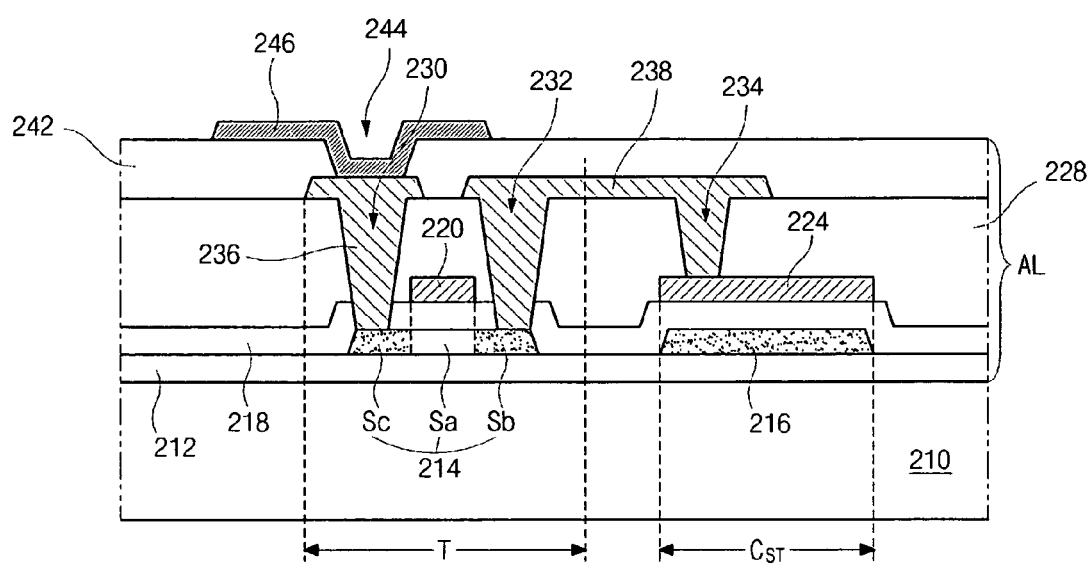
FIGS. 7A to 7C are schematic cross-sectional views showing a fabricating process of an organic electroluminescent display device of FIG. 6.
Figure 7B:
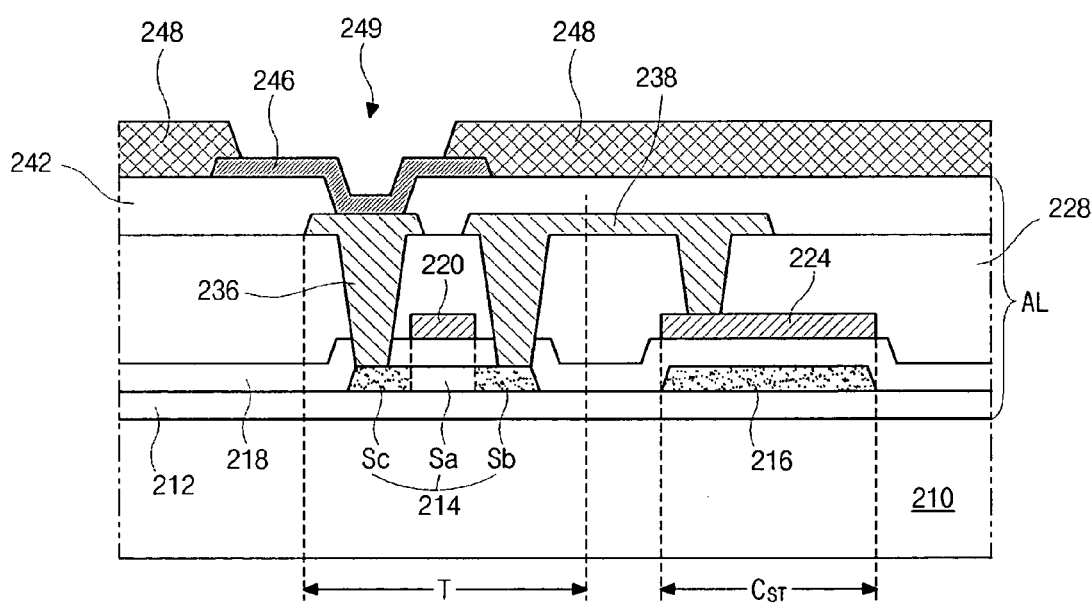
Figure 7C:
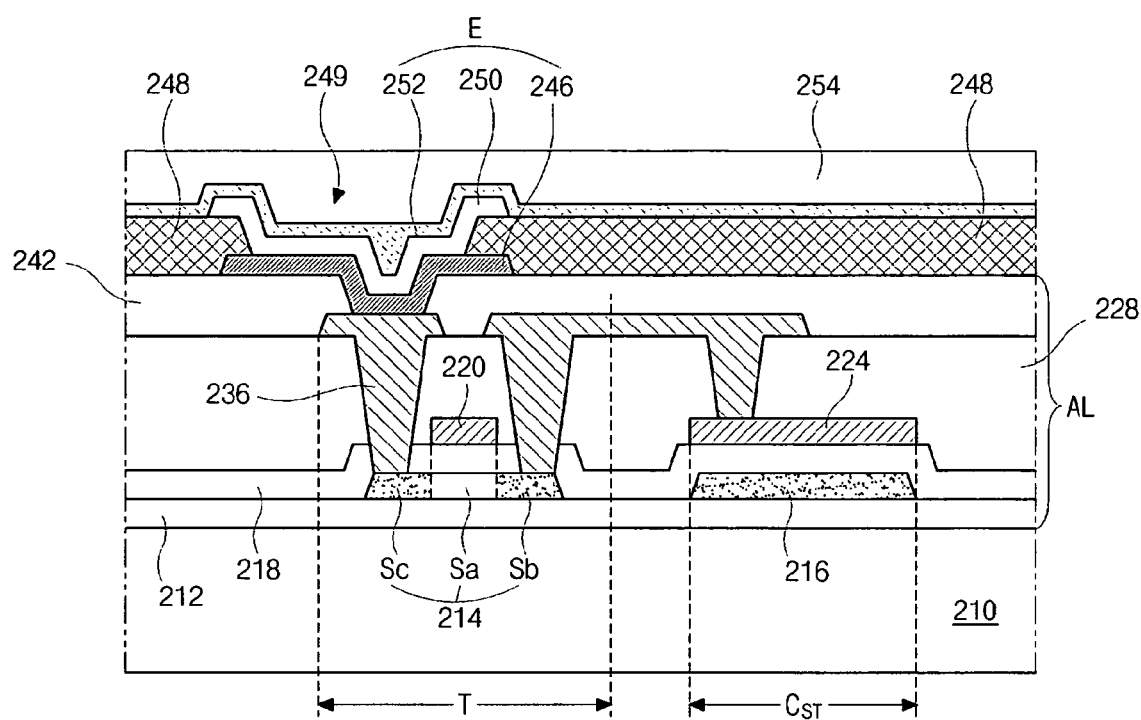

FIGS. 7A to 7C are schematic cross-sectional views showing a fabricating process of an organic electroluminescent display device of FIG. 6.

In FIG. 7A, a buffer layer 212 is formed on a substrate 210. A semiconductor layer 214 of polycrystalline silicon and a first capacitor electrode 216 are formed on the buffer layer 212 through a first mask process. The polycrystalline silicon may be obtained by crystallizing amorphous silicon using a laser or a heat. Next, the first capacitor electrode 216 is doped with impurities through a second mask process. A gate insulating layer 218 is formed on the semiconductor pattern 214 and the first capacitor electrode 216. Next, a gate electrode 220 and a second capacitor electrode 224 are formed on the gate insulating layer 218 through a third mask process. The gate electrode 220 and the second capacitor electrode 224 correspond to a central portion of the semiconductor pattern 214 and the first capacitor electrode 216, respectively. Then, the semiconductor layer 214 is doped with impurities using the gate electrode 220 as a doping mask. Since the gate electrode 214 shields the central portion of the semiconductor layer 214, side portions of the semiconductor layer 214 are doped with impurities and the central portion of the semiconductor layer 214 remains intrinsic. After the doping step, the semiconductor layer 214 includes an active region "Sa" corresponding to the gate electrode 220, and a source and a drain regions "Sb" and "Sc" at both sides of the active region "Sa." After an activation step for the doped impurities, an interlayer insulating layer 228 is formed on the gate electrode 220 and the second capacitor electrode 224. The first and second capacitor electrodes 216 and 224 constitute a storage capacitor "$C_{ST}$" with the gate insulating layer 218 interposed between the first and second capacitor electrodes 216 and 224.

Next, the interlayer insulating layer 228 and the gate insulating layer 218 are etched through a fourth mask process. Accordingly, a first contact hole 230 exposing the drain region "Sc" and a second contact hole 232 exposing the source region "Sb" are formed in the interlayer insulating layer 228 and the gate insulating layer 218, and a third contact hole 234 exposing the second capacitor electrode 224 is formed in the interlayer insulating layer 228. Next, a drain electrode 236 and a source electrode 238 are formed on the interlayer insulating layer 228 through a fifth mask process.

The drain electrode 236 is connected to the drain region "Sc" through the first contact hole 230. In addition, the source electrode 238 is connected to the source region "Sb" through the second contact hole 232 and is connected to the second capacitor electrode 224 through the third contact hole 234. The semiconductor layer 214, the gate electrode 220, the drain electrode 236 and the source electrode 238 constitute a thin film transistor "T." Then, a passivation layer 242 is formed on the drain electrode 236 and the source electrode 238. Next, the passivation layer 242 is etched through a sixth mask process to form a drain contact hole 244 exposing the drain electrode 236. Next, a first electrode 246 is formed on the passivation layer 242 through a seventh mask process. The first electrode 246 is connected to the drain electrode 236 through the drain contact hole 244. Although not shown in FIG. 7A, the first electrode 246 of one pixel region is separated from an adjacent first electrode in another pixel region.

In FIG. 7B, a bank layer 248 is formed on the passivation layer 242 through an eighth mask process. The bank layer 248 covers edge portions of the first electrode 246, and has an open portion exposing the first electrode 246. In addition, the bank layer 248 is formed of a visible-shielding material shielding a visible ray. When the visible-shielding material having a transmittance lower than about 10% for visible ray having a wavelength within a range of about 380 nm to about 780 nm is used for the bank layer 248, ambient light toward the TFT "T," the storage capacitor "$C_{ST}$" and the plurality of signal lines may be shielded by the bank layer 248. Accordingly, most of reflection of the ambient light from the TFT "T," the storage capacitor "$C_{ST}$" and the plurality of signal lines may be prevented and reduction of contrast ratio is prevented.

In FIG. 7C, an organic luminescent layer 250 and a second electrode 252 are sequentially formed on the first electrode 246 and the bank layer 248. Then, a protection layer 254 is formed on the second electrode 252.

Figure 8:
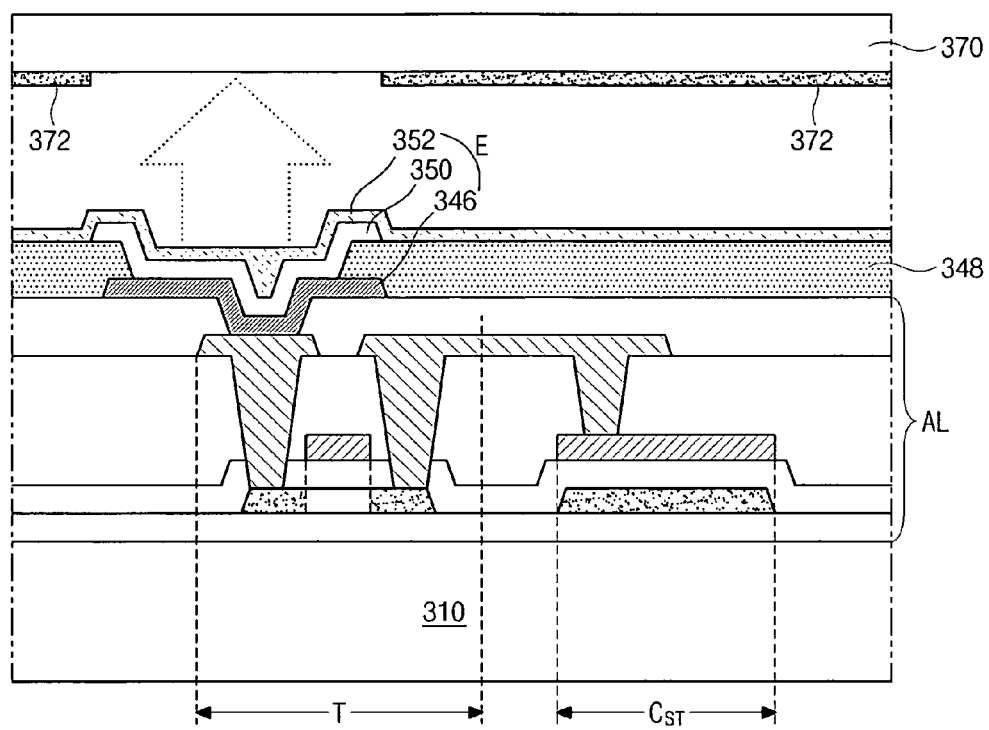
FIG. 8 is a schematic cross-sectional view showing one pixel region of an active matrix organic electroluminescent display device according to another exemplary embodiment of the present invention.
Figure 9:
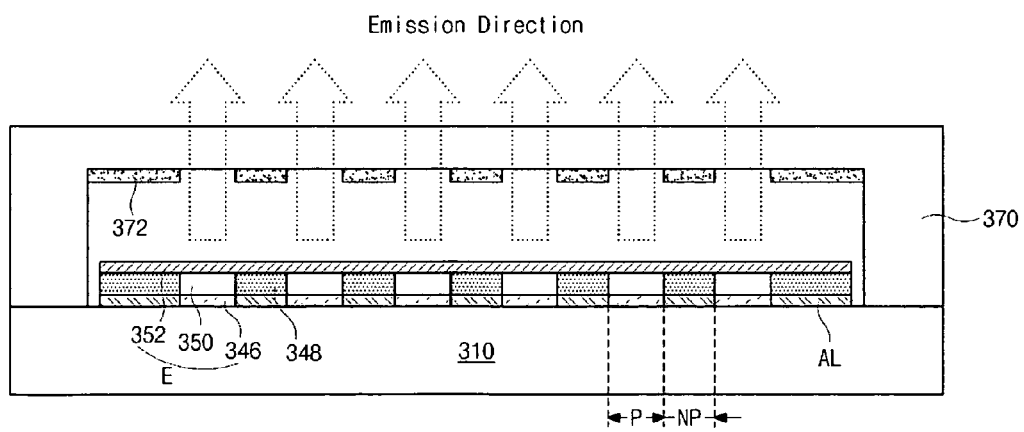
FIG. 9 is schematic cross-sectional view showing a whole active matrix organic electroluminescent display device according to another exemplary embodiment of the present invention.

FIGS. 8 and 9 are schematic cross-sectional views showing an active matrix organic electroluminescent display device according to another exemplary embodiment of the present invention. FIG. 8 shows a portion of the active matrix organic electroluminescent display (AMOELD) device corresponding to one pixel region, while FIG. 9 shows a whole AMOELD device.

In FIGS. 8 and 9, an array layer "AL" including a thin film transistor "TFT," a storage capacitor "$C_{ST}$" and a plurality of signal lines (not shown) such as gate lines and data lines is formed on a substrate 310 having a pixel region "P" and a non-pixel region "NP," and an organic electroluminescent (EL) diode "E" including a first electrode 346, an organic luminescent layer 350 and a second electrode 352 is formed on the array layer "AL." The non-pixel region "NP" surrounding the pixel region "P" represents a portion where light is not emitted and which is not used for displaying images. For example, the non-pixel region "NP" corresponds to an area between the adjacent first electrodes 346. An encapsulation substrate 370 is disposed to face and be spaced apart from the organic EL diode "E." A black matrix 372 corresponding to the non-pixel region "NP" is formed on an inner surface of the encapsulation substrate 370.

When the second electrode 352 is formed to be transparent and, light generated in the organic luminescent layer 350 is emitted through the second electrode 352 and the organic EL display device may be referred to as a top emission type. In this embodiment, the black matrix 372 is formed of a visible-shielding material shielding a visible ray and the encapsulation substrate 370 is formed of a transparent material. When the visible-shielding material having a transmittance lower than about 10% for visible ray having a wavelength within a range of about 380 nm to about 780 nm is used for the black matrix 372, ambient light toward the TFT "T," the storage capacitor "$C_{ST}$" and the plurality of signal lines may be shielded by the black matrix 372. Moreover, since the black matrix 372 covers the second electrode 352 in the non-pixel region "NP," ambient light toward the second electrode 352 in the non-pixel region "NP" may be shielded by the black matrix 372. Accordingly, most of reflection of the ambient light from the TFT "T," the storage capacitor "$C_{ST}$," the plurality of signal lines and the second electrode 352 may be prevented and reduction of contrast ratio is prevented.

Even though the organic EL display device of FIGS. 8 and 9 has an active matrix type including a switching element such as the TFT "T," an encapsulation substrate having a black matrix may be used for a passive matrix organic EL display device in another embodiment.

Figure 10:
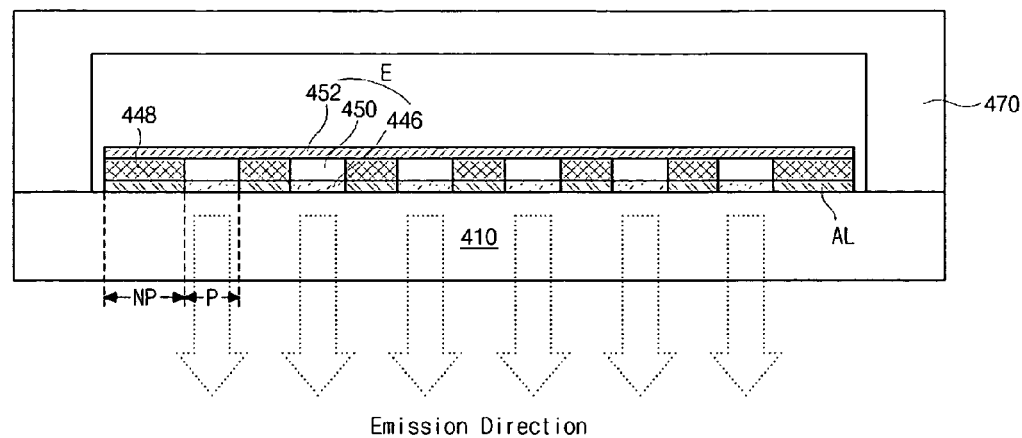
FIG. 10 is a schematic cross-sectional view showing an organic electroluminescent display device according to another embodiment of the present invention.

FIG. 10 is a schematic cross-sectional view showing an organic electroluminescent display device according to another embodiment of the present invention.

In FIG. 10, an array layer "AL" is formed on a substrate 410 having a pixel region "P" and a non-pixel region "NP," and an organic electroluminescent (EL) diode "E" including a first electrode 446, an organic luminescent layer 450 and a second electrode 452 is formed on the array layer "AL." The first electrode 416 corresponds to the pixel region "P." A bank layer 448 is formed between the array layer "AL" and the second electrode 448. The bank layer 448 corresponds to the non-pixel region "NP" and may cover edge portions of the first electrode 446. In addition, an encapsulation substrate 470 is disposed to face and be spaced apart from the second electrode 452.

When the first electrode 446 is formed to be transparent and the encapsulation substrate 470 is formed of an opaque material, light generated in the organic luminescent layer 450 is emitted through the first electrode 446 and the organic EL display device may be referred to as a bottom emission type. In this embodiment, the bank layer 448 is formed of a visible-shielding material shielding a visible ray. When the visible-shielding material having a transmittance lower than about 10% for visible ray having a wavelength within a range of about 380 nm to about 780 nm is used for the bank layer 448, ambient light toward the second electrode 452 may be shielded by the bank layer 448. Accordingly, most of reflection of the ambient light from the second electrode 452 may be prevented and reduction of contrast ratio is prevented.

Even though the organic EL display device of FIG. 10 has an active matrix type including a switching element such as the thin film transistor (TFT), an encapsulation substrate of an opaque material and a back layer of a visible-shielding material may be used for a passive matrix organic EL display device in another embodiment.

Figure 11A:
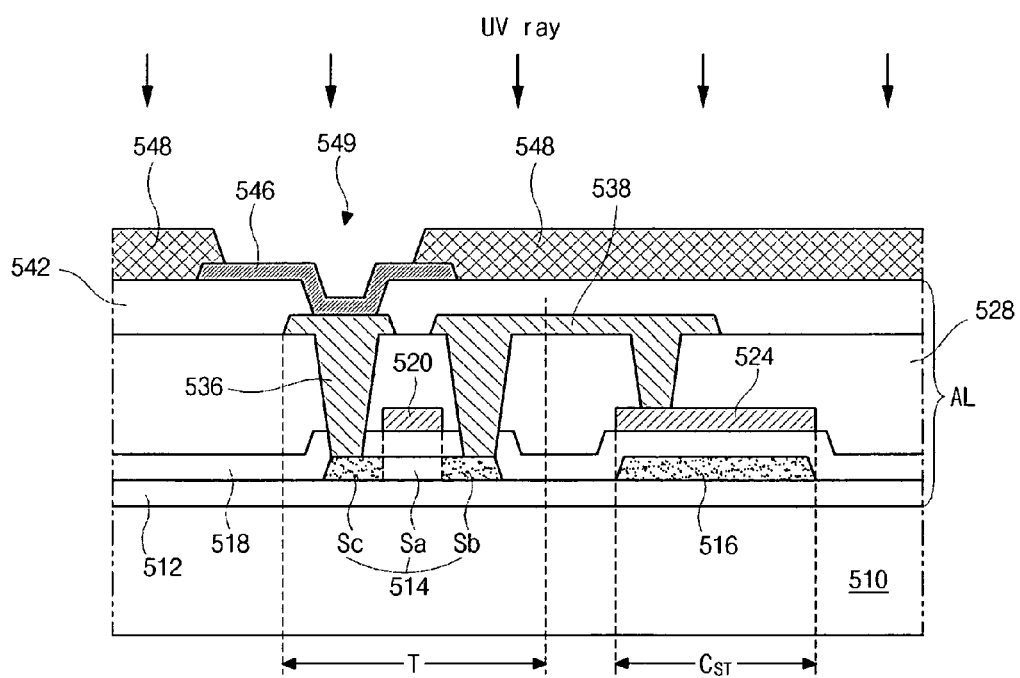
FIGS. 11A and 11B are schematic cross-sectional views showing a fabricating process of an organic electroluminescent (EL) display device according to another exemplary embodiment of the present invention.
Figure 11B:
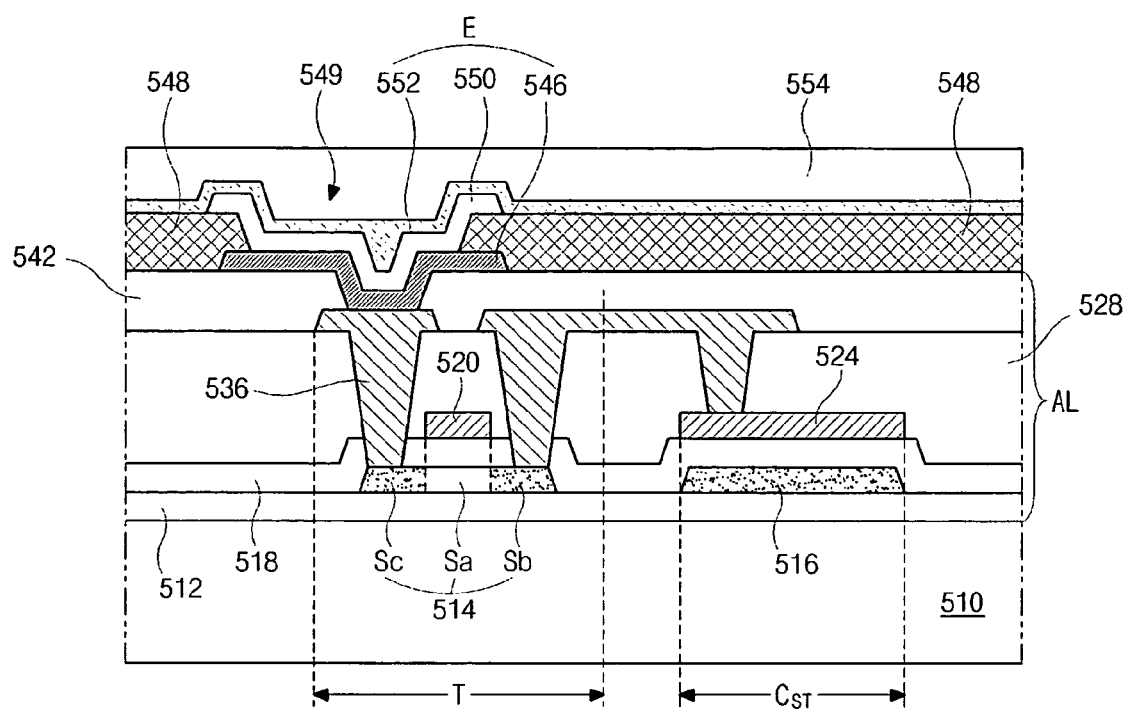

FIGS. 11A and 11B are schematic cross-sectional views showing a fabricating process of an organic electroluminescent (EL) display device according to another exemplary embodiment of the present invention.

In FIG. 11A, a thin film transistor (TFT) "T" including a semiconductor layer 514, a gate electrode 520, a drain electrode 536 and a source electrode 538 and a storage capacitor "$C_{ST}$" including a first electrode 516 and a second electrode 524 are formed on a substrate 510. After a first electrode 546 connected to the drain electrode 536 is formed on a passivation layer 542, a bank layer 548 is formed on the passivation layer 542. The bank layer covers edge portions of the first electrode 546 and has an open portion 549 exposing the first electrode 546.

In addition, the bank layer 548 is formed of a UV-shielding material shielding an ultra violet (UV) ray. The UV-shielding material may have a transmittance lower than about 3% for UV ray having a wavelength within a range of about 150 nm to about 300 nm. In other words, the UV-shielding material may have an optical density (OD) higher than about 1.5 for UV ray corresponding to a range of about 150 nm to about 300 nm. For example, the UV-shielding material may include an organic insulating material such as polyimid (PI), benzocyclobutene (BCB) and acrylic resin. Further, the bank layer 548 may be formed to have a thickness greater than about 1 micrometer.

After the bank layer 548 is formed, a cleaning step using a UV ray is performed for removing particles from the second electrode 546. Since the bank layer 548 is formed of a UV-shield material, the UV ray toward the semiconductor layer 514 is shielded during the cleaning step by the bank layer 548. Accordingly, deterioration of the TFT in characteristics is prevented.

In FIG. 11B, after the cleaning step, an organic luminescent layer 550 and a second electrode 552 are sequentially formed on the first electrode 546 to constitute an organic EL diode "E." A protection layer 554 is formed on the second electrode 552.

In an organic EL display device according to another exemplary embodiment of the present invention, a bank layer may be formed of a light-shielding material shielding visible ray and UV ray. For example, the light-shielding material may have a transmittance lower than about 3% for UV ray having a wavelength within a range of about 150 nm to about 300 nm and lower than about 10% for visible ray having a wavelength within a range of about 380 nm to about 780 nm. Accordingly, deterioration of the TFT in characteristics due to UV ray is prevented and reduction of contrast ratio of the organic EL display device due to reflection of ambient light is prevented.

In the present invention, reduction of contrast ratio of an organic EL display device is prevented by using a bank layer of a material shielding visible ray or by using a black matrix on an encapsulation substrate. Furthermore, deterioration of a TFT in characteristics is prevented by using a bank layer of a material shielding UV ray. Therefore, display quality of the organic EL display device is improved.

It will be apparent to those skilled in the art that various modifications and variations can be made in the organic electroluminescent display device and the method of fabricating the same of the present invention without departing from the sprit or scope of the invention. Thus, it is intended that the present invention covers the modifications and variations of this invention provided they come within the scope of the appended claims and their equivalents.

What is claimed is:

1. An organic electroluminescent display device, comprising:
    a substrate having a pixel region and a non-pixel region surrounding the pixel region;
    a thin film transistor on the substrate and including a semiconductor layer, a gate electrode, a source electrode and a drain electrode;
    a storage capacitor connected to the source electrode and including a first capacitor electrode and a second capacitor electrode, wherein the first capacitor electrode is formed of a same material and on a same layer as the semiconductor layer, and the second capacitor electrode is formed of a same material and on a same layer as the gate electrode, wherein the second capacitor electrode is connected to the source electrode;
    a first electrode on the substrate in the pixel region and connected to the drain electrode;
    an organic luminescent layer on the first electrode;
    a second electrode on the organic luminescent layer;
    a light-shielding means corresponding to the non-pixel region; and
    an encapsulation substrate formed of a transparent material and configured to face and be spaced apart from the second electrode,
    wherein the light-shielding means includes a black matrix on an inner surface of the encapsulation substrate,
    wherein the light-shielding means includes a material having a transmittance lower than about 10% for a visible ray,
    wherein the first electrode, the organic luminescent layer and the second electrode form an organic electroluminescent diode, and light emitted from the organic electroluminescent diode directly goes onto the encapsulation substrate without the presence of a color conversion element,
    wherein the light-shielding means is spaced apart from the second electrode, and
    wherein the light-shielding means covers the storage capacitor.

2. The device according to claim 1, wherein the visible ray has a wavelength within a range of about 380 nm to about 780 nm.

3. The device according to claim 1, further comprising a switching element connected to the first electrode.

4. The device according to claim 3, wherein the first electrode is separately formed in the pixel region and the second electrode is formed to cover an entire surface of the substrate.

5. The device according to claim 1, wherein the second electrode is transparent.

6. A method of fabricating an organic electroluminescent display device, comprising:
    providing a substrate having a pixel region and a non-pixel region surrounding the pixel region;
    forming a thin film transistor on the substrate and including a semiconductor layer, a gate electrode, a source electrode and a drain electrode;
    forming a storage capacitor connected to the source electrode and including a first capacitor electrode and a second capacitor electrode, wherein the first capacitor electrode is formed of a same material and on a same layer as the semiconductor layer, and the second capacitor electrode is formed of a same material and on a same layer as the gate electrode, wherein the second capacitor electrode is connected to the source electrode;
    forming a first electrode on the substrate in the pixel region and connected to the drain electrode;
    forming an organic luminescent layer on the first electrode;
    forming a second electrode on the organic luminescent layer; and
    forming a light-shielding means corresponding to the non-pixel region; and
    disposing an encapsulation substrate formed of a transparent material to face and be spaced apart from the second electrode,
    wherein the forming the light-shielding means includes forming a black matrix on an inner surface of the encapsulation substrate,
    wherein the light-shielding means is formed of a material having a transmittance lower than about 10% for a visible ray,
    wherein the first electrode, the organic luminescent layer and the second electrode form an organic electroluminescent diode, and light emitted from the organic electroluminescent diode directly goes onto the encapsulation substrate without the presence of a color conversion element,
    wherein the light-shielding means is spaced apart from the second electrode, and
    wherein the light-shielding means covers the storage capacitor.

* * * * *